US009368518B2

(12) United States Patent
Lee et al.

(10) Patent No.: US 9,368,518 B2
(45) Date of Patent: Jun. 14, 2016

(54) THIN FILM TRANSISTOR ARRAY PANEL AND METHOD FOR MANUFACTURING THE SAME

(71) Applicant: SAMSUNG DISPLAY CO., LTD., Yongin, Gyeonggi-Do (KR)

(72) Inventors: Doo Youl Lee, Seoul (KR); Se Myung Kwon, Asan-si (KR); Hyuk Soon Kwon, Suwon-si (KR); Jang Soo Kim, Asan-si (KR); Hyung Min Kim, Yongin-si (KR); Jin-Ho Oh, Seoul (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/303,794

(22) Filed: Jun. 13, 2014

(65) Prior Publication Data

US 2015/0200208 A1     Jul. 16, 2015

(30) Foreign Application Priority Data

Jan. 10, 2014   (KR) ..................... 10-2014-0003547

(51) Int. Cl.

| | | |
|---|---|---|
| H01L 27/12 | (2006.01) | |
| H01L 29/417 | (2006.01) | |
| H01L 21/02 | (2006.01) | |
| H01L 21/768 | (2006.01) | |
| H01L 29/786 | (2006.01) | |
| H01L 21/3213 | (2006.01) | |

(52) U.S. Cl.
CPC ........ *H01L 27/124* (2013.01); *H01L 21/02164* (2013.01); *H01L 21/02565* (2013.01); *H01L 21/76852* (2013.01); *H01L 27/1225* (2013.01); *H01L 27/1288* (2013.01); *H01L 29/41733* (2013.01); *H01L 29/7869* (2013.01); *H01L 21/32139* (2013.01)

(58) Field of Classification Search
CPC ............ H01L 2924/00; H01L 27/1214; H01L 29/7869; H01L 27/3262; H01L 27/124; H01L 29/4908; H01L 29/78624; H01L 29/78696; H01L 27/1248; H01L 27/10873; H01L 27/3248; H01L 29/42384; H01L 23/522; H01L 27/1225; H01L 27/1288; H01L 29/41733; H01L 21/02164; H01L 21/02565; H01L 21/76852; H01L 21/32139
See application file for complete search history.

(56) References Cited

U.S. PATENT DOCUMENTS

| | | | |
|---|---|---|---|
| 6,255,706 B1* | 7/2001 | Watanabe ............. | H01L 29/458 257/350 |
| 6,624,864 B1* | 9/2003 | Kubo .................. | G02F 1/13458 349/123 |

(Continued)

FOREIGN PATENT DOCUMENTS

| | | |
|---|---|---|
| JP | 2013-062529 | 4/2013 |
| KR | 1020120120398 | 1/2012 |

*Primary Examiner* — Yasser A Abdelaziez
*Assistant Examiner* — Farun Lu
(74) *Attorney, Agent, or Firm* — F. Chau & Associates, LLC

(57) ABSTRACT

A thin film transistor array panel includes: a gate conductor disposed on a substrate and including a gate line and a gate electrode, a semiconductor layer overlapping the gate electrode and including an oxide semiconductor, a data conductor including a data line intersecting the gate line, a source electrode connected to the data line, and a drain electrode facing the source electrode, a sidewall covering side surface parts of the drain electrode and the source electrode adjacent to a channel region of the semiconductor layer, and a passivation layer covering the source electrode, the drain electrode, and the sidewall.

20 Claims, 12 Drawing Sheets

(56) References Cited

U.S. PATENT DOCUMENTS

| | | | |
|---|---|---|---|
| 8,148,245 B2* | 4/2012 | Ikisawa et al. | 438/482 |
| 2011/0133177 A1* | 6/2011 | Suzawa | H01L 27/1225 257/43 |
| 2011/0298057 A1* | 12/2011 | Kato | G11C 16/0466 257/392 |
| 2012/0274355 A1* | 11/2012 | Nishijima | 326/41 |
| 2013/0334534 A1* | 12/2013 | Fujii | H01L 27/1248 257/59 |

* cited by examiner

THIN FILM TRANSISTOR ARRAY PANEL AND METHOD FOR MANUFACTURING THE SAME

CROSS-REFERENCE TO RELATED APPLICATION

This application claims priority to Korean Patent Application No. 10-2014-0003547 filed on Jan. 10, 2014, the disclosure of which is hereby incorporated by reference herein in its entirety.

TECHNICAL FIELD

The present disclosure relates to a thin film transistor array panel and a manufacturing method thereof.

DISCUSSION OF THE RELATED ART

A flat panel display (FPD), such as an organic light emitting diode display (OLED), a liquid crystal display (LCD), and an electrophoretic display (EPD), includes a display panel including a field generating electrode and an electro-optical active layer. As the electro-optical active layer, the panels of the OLED, the LCD, and the EPD respectively include an organic light emission layer, a liquid crystal layer, and particles having a charge. The field generating electrode is connected to a switching element such as a thin film transistor to receive a data signal, and the electro-optical active layer converts the data signal to an optical signal to display an image.

In the flat panel display, a thin film transistor (TFT) which is a three-terminal element is used as the switching element. To that end, the flat panel display includes signal lines such as a gate line for transferring a scanning signal for controlling the thin film transistor and a data line for transferring a signal to be applied to a pixel electrode.

Meanwhile, as the area of a display device increases, an oxide semiconductor technology is being researched to implement high-speed driving, and a method for reducing resistance of the signal line is also being researched. However, a metal material or its oxide used in a main wiring layer to reduce resistance of a signal line may contaminate a semiconductor layer formed of an oxide semiconductor, thereby deteriorating reliability of devices.

SUMMARY

Exemplary embodiments of the present invention have been made in an effort to provide a thin film transistor array panel and a manufacturing method thereof having the benefits of preventing formation of a metal oxide at a side surface of a main wring layer and suppressing contamination of a semiconductor layer caused by the main wring layer.

An exemplary embodiment of the present invention provides a thin film transistor array panel including: a gate conductor disposed on a substrate and including a gate line and a gate electrode, a semiconductor layer overlapping the gate electrode and including an oxide semiconductor, a data conductor including a data line intersecting the gate line, a source electrode connected to the data line, and a drain electrode facing the source electrode, a sidewall covering side surface parts of the drain electrode and the source electrode adjacent to a channel region of the semiconductor layer, and a passivation layer covering the source electrode, the drain electrode, and the sidewall.

A thickness of the sidewall may increase from a top surface thereof toward a bottom surface thereof.

The sidewall may have a thickness of at least about 2000 Å at the thickest portion thereof.

The sidewall may have a thickness of at least about 1000 Å at about a position which is about half of the entire height thereof.

The sidewall may include an inorganic insulating material, particularly a silicon oxide.

The semiconductor layer may include at least a ternary-based semiconductor oxide containing a trivalent element, a bivalent element, and oxygen.

The data conductor may include a barrier layer, a main wiring layer, and a capping layer, and the main wiring layer may include a metal selected from the group consisting of a copper-based metal, an aluminum-based metal, a silver-based metal, a molybdenum-based metal, and a titanium-based metal.

The passivation layer may include a silicon oxide.

The semiconductor layer may have substantially the same plane pattern as a plane pattern of the source electrode, the drain electrode, and the data line except for the channel region.

An exemplary embodiment of the present invention provides a manufacturing method of a thin film transistor. The manufacturing method includes: forming a gate conductor including a gate line and a gate electrode on a substrate, forming a gate insulating layer on the gate conductor, forming a semiconductor layer including an oxide semiconductor on the gate insulating layer, forming a data conductor including a source electrode and a drain electrode on the semiconductor layer, forming an insulating layer on the data conductor, removing the insulating layer such that the insulating layer partially remains on side surface parts of the drain electrode and the source electrode adjacent to a channel region of the semiconductor layer to form a sidewall covering the side surface parts, and forming a passivation layer covering the source electrode, the drain electrode, and the sidewall.

The manufacturing method may further include performing a plasma treatment process before the forming of the passivation layer after the forming of the sidewall.

The insulating layer may be formed to have a thickness of at least about 2000 Å.

The insulating layer may include a silicon oxide.

The removing of the insulating layer to form the sidewall may be performed by a dry etchback process.

The removing of the insulating layer to form the sidewall may be performed by removing the insulating layer such that the insulating layer partially remains on the channel region of the semiconductor layer, as well as on the side surface parts of the drain electrode and the source electrode adjacent to the channel region of the semiconductor layer.

The semiconductor layer may include at least a ternary-based semiconductor oxide containing a trivalent element, a bivalent element, and oxygen.

The data conductor may include a barrier layer, a main wiring layer, and a capping layer, and the main wiring layer may include a metal selected from the group consisting of a copper-based metal, an aluminum-based metal, a silver-based metal, a molybdenum-based metal, and a titanium-based metal.

The forming of the semiconductor layer and the forming of the data conductor may be simultaneously performed by using one mask.

The semiconductor layer may have substantially the same plane pattern as a plane pattern of the source electrode, the drain electrode, and the data line except for the channel region.

In accordance with an exemplary embodiment, a manufacturing method of a thin film transistor array panel is provided. The method includes forming a gate conductor including a gate line and a gate electrode on a substrate, sequentially forming a gate insulating layer, an oxide layer including an oxide semiconductor and a data conductor layer on the gate line and the gate electrode, forming a first photoresist pattern including a thick first portion and a relatively thin second portion on the data conductor layer, wherein the data conductor layer includes a bottom layer, a main layer disposed on the bottom layer and a top layer disposed on the main layer, simultaneously etching the bottom layer, the main layer and the top layer of the data conductor layer using the first photoresist pattern as a mask such that a side surface part of the data conductor layer is exposed, and a boundary line corresponding to the side surface part of the data conductor layer is disposed inside a region in which the first photoresist pattern is disposed, etching the oxide layer using the first photoresist pattern as a mask, removing the relatively thin second portion of the first photoresist pattern using an etch-back method such that the thick first portion of the first photoresist pattern is also etched and a width and height thereof are decreased to thereby form a second photoresist pattern, and etching the data conductor layer using the second photoresist pattern as a mask to divide the data conductor layer, thereby forming a data line, a source electrode and a drain electrode each having a triple layer structure including a barrier layer, a main wiring layer and a capping layer sequentially stacked and forming a semiconductor layer from the oxide layer. The semiconductor layer includes a projection defining a channel region of the thin film transistor array panel which is exposed by the second photoresist pattern.

In addition, the method further includes removing the second photoresist pattern, forming a protective insulating layer on exposed surfaces of the data line, the source electrode, the drain electrode, the channel region of the semiconductor layer, and the gate insulating layer after removing the second photoresist pattern. The protective insulating layer includes an inorganic insulating material and has a thickness of at least about 2000 Å, Also, the method further includes partially removing the protective insulating layer through a dry etchback method such that the protective insulating layer remaining constitutes a sidewall which covers at least side surface parts of the source electrode and the drain electrode adjacent to the channel region, in which a thickness of the sidewall gradually increases from an upper portion thereof to a lower portion thereof, performing a plasma treatment process to reduce oxygen vacancies in the channel region of the semiconductor layer after forming the sidewall, and forming a passivation layer after the plasma treatment process on the data line, the source electrode, the drain electrode, the channel region of the semiconductor layer, and a portion of the gate insulating layer which are not covered by the semiconductor layer. A thickness of the passivation layer disposed at a lower portion of the side surface parts of the source and drain electrodes is thicker than a thickness of the passivation layer disposed on the channel region.

In accordance with the exemplary embodiment of the present invention, the thin film transistor array panel can prevent or minimize formation of a metal oxide on a side surface of the main wiring layer such as a source electrode or a drain electrode. Further, it is possible to prevent ingredients of the main wiring layer or their oxides from contaminating the channel region of the semiconductor layer.

BRIEF DESCRIPTION OF THE DRAWINGS

Exemplary embodiments of the present invention can be understood in more detail from the following detailed description when taken in conjunction with the attached drawings in which.

DETAILED DESCRIPTION OF EXEMPLARY EMBODIMENTS

Figure 1:
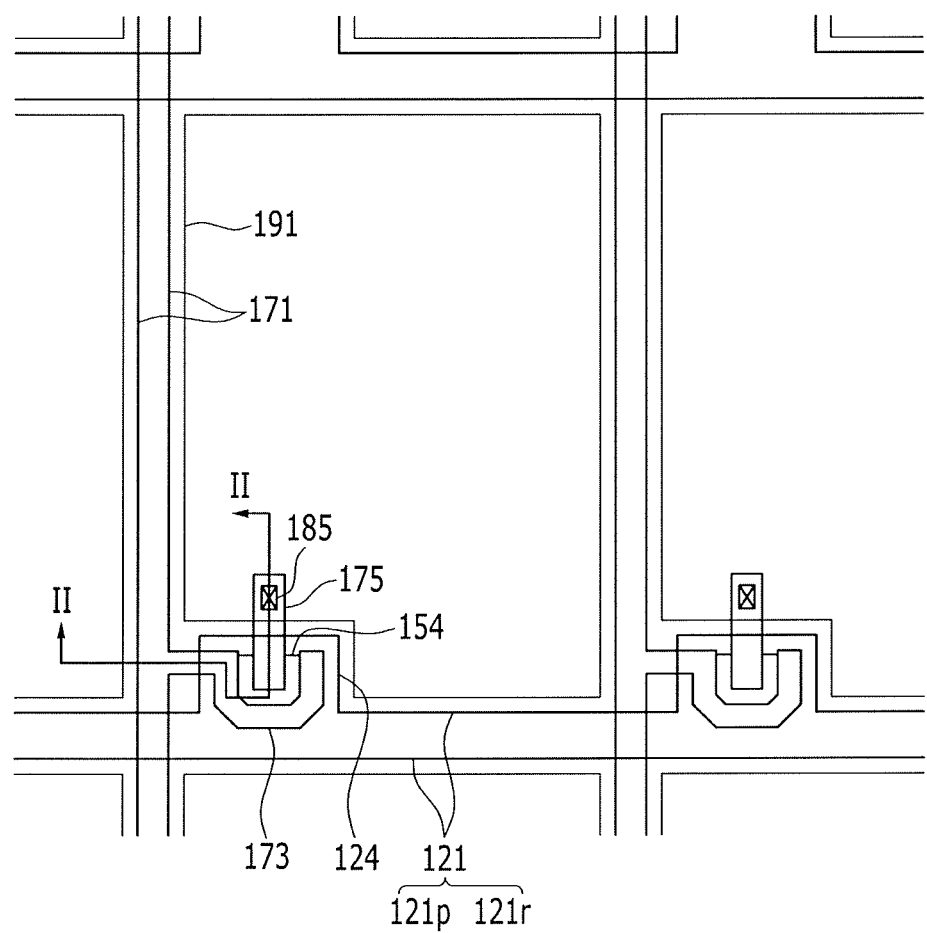
FIG. 1 is a plan view showing a thin film transistor array panel in accordance with an exemplary embodiment of the present invention.

Exemplary embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present.

As used herein, the singular forms, "a", "an", and "the" are intended to include plural forms as well, unless the context clearly indicates otherwise.

A thin film transistor array panel in accordance with an exemplary embodiment of the present invention will be described in detail with reference to the accompanying drawings.

Figure 2:
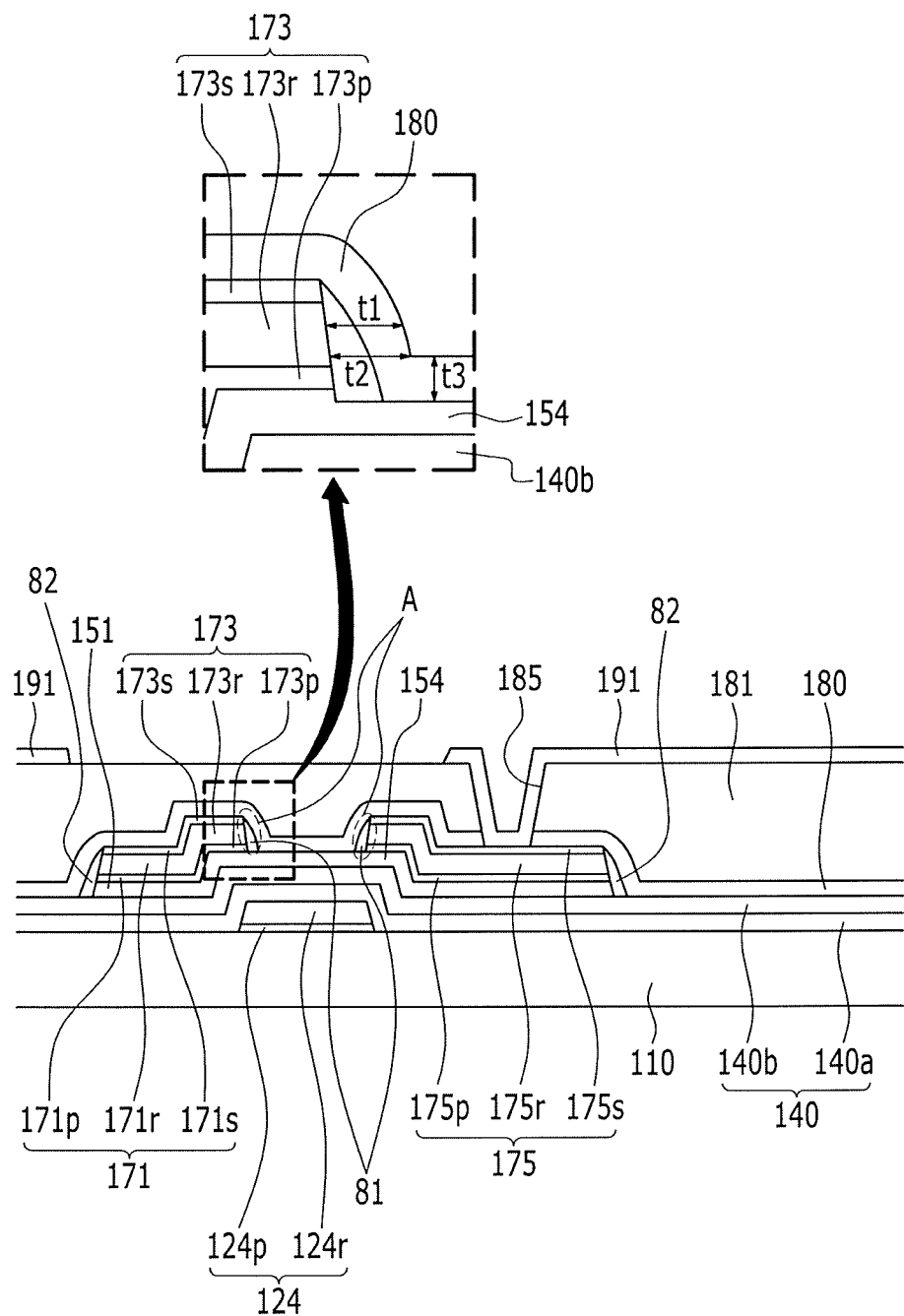
FIG. 2 is a cross-sectional view taken along the line II-II of FIG. 1.

FIG. 1 is a plan view showing the thin film transistor array panel in accordance with an exemplary embodiment of the present invention, and FIG. 2 is a cross-sectional view taken along the line II-II of FIG. 1.

Referring to FIG. 1 and FIG. 2, a gate conductor (121 and 124) is formed on a transparent insulation substrate 110 made of, for example, glass, plastic, quartz or the like in the thin film transistor array panel in accordance with the present exemplary embodiment. Further, in an exemplary embodiment, the transparent insulation substrate 110 may be, for example, a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

The gate conductor includes, for example, a plurality of gate lines 121, and a plurality of gate electrodes 124 protruded from the gate lines 121. The gate lines 121 serve to transfer gate signals and are extended, for example, primarily in a horizontal direction. The gate line 121 and the gate electrode 124 may have, for example, a dual-film structure including lower layers 121p and 124p and upper layers 121r and 124r. Each of the lower layers 121p and 124p and the upper layers 121r and 124r may be made of, for example, an aluminum-based metal such as aluminum (Al) and an aluminum alloy, a silver-based metal such as silver (Ag) and a silver alloy, a copper-based metal such as copper (Cu) and a copper alloy, a molybdenum-based metal such as molybdenum (Mo) and a molybdenum alloy, a chromium-based metal such as chromium (Cr) and a chromium alloy, a titanium-based metal such as titanium (Ti) and a titanium alloy, a tantalum-based metal such as tantalum (Ta) and a tantalum alloy, a manganese-based metal such as manganese (Mn) and a manganese alloy, or the like. For example, the lower layers 121p and 124p may include titanium and the upper layer 121r and 124r may include copper.

In FIG. 2, the gate line 121 and the gate electrode 124 are shown to be formed as dual films, but exemplary embodiments are not limited thereto, and they may be formed as a single-film or triple-film pattern Further, the lower layers 121p and 124p and the upper layers 121q and the 124q may be formed by, for example, combinations of films having different physical properties.

A gate insulating layer 140 made of an insulating material such as, for example, a silicon oxide (SiOx), a silicon nitride (SiNx), silicon oxynitride (SiOxNy), aluminum oxide (AlOx), yttrium oxide ($Y_2O_3$), hafnium oxide (HfOx), zirconium oxide (ZrOx), aluminum nitride (AlN), aluminum oxynitride (AlNO), titanium oxide (TiOx), barium titanate (BaTiO3), lead titanate ($PbTiO_3$), or a combination thereof is positioned on the gate line 121. The gate insulating layer 140 may include, for example, a first insulating layer 140a and a second insulating layer 140b. For example, the first insulating layer 140a may be made of a silicon nitride (SiNx) having a thickness of approximately 4000 Å and the second insulating layer 140b may be made of a silicon oxide (SiOx) having a thickness of approximately 500 Å. Alternatively, in an exemplary embodiment, the first insulating layer 140a may be made of, for example, a silicon oxynitride ($SiO_xN_y$) and the second insulating layer 140b may be made of, for example, a silicon oxide (SiOx). In FIG. 2, the first and second gate insulating layers 140a and 140b are shown to be formed in the dual-film pattern, but alternatively the gate insulating layer 140 may be formed, for example, in a single-film pattern or in a multi-film pattern including three layers or more.

A plurality of semiconductor layers 151 made of, for example, an oxide semiconductor are formed on the gate insulating layer 140. The semiconductor layers 151 are extended, for example, primarily in a vertical direction and include a plurality of projections 154 that protrude toward the gate electrode 124. The semiconductor layers 151 may include, for example, at least a ternary-based semiconductor oxide containing a trivalent element (group 3A element) such as indium (In) and gallium (Ga), a bivalent element (group 2B element) such as zinc (Zn), and oxygen. For example, the semiconductor layers 151 may be an indium-gallium-zinc oxide. The semiconductor layers 151 may be formed as a single film or multiple films. For example, in the case that the semiconductor layers 151 are formed as double films, a lower film may be an indium-gallium-zinc oxide (IGZO), and an upper film may be a gallium-zinc oxide (GZO).

A data conductor (171, 173, and 175) is formed on the semiconductor layer 151 and the gate insulating layer 140.

The data conductor includes, for example, a plurality of data lines 171, a plurality of source electrodes 173 connected to the data lines 171, and a plurality of drain electrodes 175. The data lines 171 serve to transfer data signals and are extended, for example, primarily in the vertical direction to cross the gate lines 121 while insulated therefrom. The source electrodes 173 are extended from the data lines 171 to be overlapped with the gate electrodes 124 to have, for example, a substantially U shape. The drain electrodes 175 are separated from the data lines 171 to upwardly extend from the center of the U shape of the source electrode 173.

Each of the data line 171, the source electrode 173, and the drain electrode 175 has, for example, a triple layer structure including a barrier layer 171p, 173p, and 175p, a main wiring layer 171r, 173r, and 175r, and a capping layer 171s, 173s, and 175s. Alternatively, in an embodiment, any one of the barrier layers 171p, 173p, and 175p and the capping layers 171s, 173s, and 175s, or all of them, may be omitted. The barrier layers 171p, 173p, and 175p may be formed of, for example, a metal oxide such as an indium-zinc oxide, a gallium-zinc oxide, and an aluminum-zinc oxide. The barrier layers 171p, 173p, and 175p serve as anti-diffusion layers for preventing diffusion of a material such as, for example, copper of the main wiring layers 171r, 173r, and 175r to the semiconductor layer 151. Alternatively, in an embodiment, the barrier layers 171p, 173p, and 175p may include, for example, nickel chromium (NiCr). For example, the barrier layers 171p, 173p, and 175p may be made of nickel chromium (NiCr) or a nickel chromium alloy The barrier layers 171p, 173p, and 175p may serve to increase a contact characteristic between the main wiring layers 171r, 173r, and 175r and the semiconductor layer 151 to prevent a component of the main wiring layers 171r, 173r, and 175r from reacting with a component of the semiconductor layer 151. Alternatively in an embodiment, the barrier layers 171p, 173p, and 175p may be made of, for example, a titanium (Ti), chromium (Cr), tantalum (Ta), or molybdenum (Mo)-based metal, or a transparent conductive oxide (TCO) such as, for example, indium tin oxide (ITO) and indium zinc oxide (IZO).

The main wiring layers 171r, 173r, and 175r may be made of, for example, a copper-based metal such as copper (Cu) or a copper alloy. Alternatively, the main wiring layers 171r, 173r, and 175r may be made of, for example, an aluminum-based metal such as aluminum (Al) and an aluminum alloy, a silver-based metal such as silver (Ag) and a silver alloy, a molybdenum-based metal such as molybdenum (Mo) and a molybdenum alloy, or a titanium-based metal such as titanium (Ti) and a titanium alloy. The main wiring layers 171r, 173r, and 175r may have a thickness of approximately 500 Å, for example.

The capping layers 171s, 173s, and 175s are respectively positioned on the main wiring layers 171r, 173r, and 175r. The capping layers 171s, 173s, and 175s may serve to prevent oxidation of a metal component of the main wiring layers 171r, 173r, and 175r. The capping layers 171s, 173s, and 175s may be made of, for example, nickel chromium (NiCr), copper manganese (CuMn), or the like, or of TCO.

Referring to FIG. 2, a portion that is not covered by the data line 171 and the drain electrode 175 exists between the source electrode 173 and the drain electrode 175 in the projection 154 of the semiconductor layer 151. The semiconductor layer 151 may have, for example, substantially the same pattern as that of the data line 171 and the drain electrode 175 in a plan view, except for a non-covered portion of the projection 154.

One gate electrode 124, one source electrode 173, and one drain electrode 175 together with the projection 154 of the semiconductor layer 151 constitute one thin film transistor (TFT), and a channel region of the thin film transistor is formed at the projection 154 between the source electrode 173 and the drain electrode 175. In the present exemplary embodiment, side surfaces of the source electrode 173 and the drain electrode 175 which are adjacent to the channel region are covered by sidewalls 81. Hereinafter, side surfaces of the data conductor (171, 173, and 175) are referred to as side surface parts. Particularly, the side surfaces of the source electrode 173 and the drain electrode 175 which are adjacent to the channel region are referred to as side surface parts A.

The sidewalls 81 serve to protect the side surface parts A of the source electrode 173 and the drain electrode 175 to not be exposed in a following process so as to suppress a metal oxide from being formed in the side surface parts A and suppress the semiconductor layer 151 from being contaminated by components of the source electrode 173 and the drain electrode 175.

As the following process after the source electrode 173 and the drain electrode 175 are formed, a process for reducing oxygen vacancies of the semiconductor layer 151 is performed by generating a plasma while injecting, e.g., nitrogen oxide ($N_2O$) gas. In this case, the metal components of the side surface parts A of the source electrode 173 and the drain electrode 175 may be oxidized. In this process, the exposed channel region of the thin film transistor may be contaminated by the components of the source electrode 173 and the drain electrode 175, thereby deteriorating the characteristic of the thin film transistor. Further, an oxide may be formed on the side surface parts A of the source electrode 173 and the drain electrode 175, thereby damaging profiles of the side surface parts A. However, in the present exemplary embodiment, the side surface parts A of the source electrode 173 and the drain electrode 175 are protected by the sidewalls 81 so as not to be exposed to the plasma. Accordingly, it is possible to significantly or completely remove the possibility of the sidewall 81 being oxidized, or the components of the source electrode 173 and the drain electrode 175 or their oxides from being diffused from the sidewalls 81 to the channel region.

The sidewalls 81 may include, for example, an inorganic insulating material such as a silicon oxide ($SiOx$), a silicon nitride ($SiNx$), and a silicon oxynitride ($SiO_xN_y$). For example, the sidewalls 81 may be made of a silicon oxide ($SiOx$). The thickness of the sidewalls 81 may be reduced from a lower side thereof (e.g., a side adjacent to the semiconductor layer 151) toward an upper side thereof (e.g., the capping layer). For example, the thickness of the sidewalls 81 at a position which is about half of the height of the source electrode 173 and the drain electrode 175 may be about half of the thickness thereof at a lowermost side of the sidewall 81. The thickest thickness of the sidewalls 81 may be, for example, greater than 2000 Å.

A passivation layer 180 is formed on the data line 171, the source electrode 173, and the drain electrode 175. The passivation layer 180 may be made of, for example, an inorganic insulating material such as a silicon nitride or a silicon oxide, an organic insulating material, or a low dielectric constant insulating material. For example, the passivation layer 180 may be a single film formed of a silicon oxide with a thickness of, e.g., about 1500 Å, but exemplary embodiments are not limited thereto. The passivation layer 180 may be formed as, for example, multiple films, e.g., double films. For example, in this case, the passivation layer 180 may include a first passivation layer made of silicon oxide and a second passivation layer made of silicon nitride, each thickness of which may be, e.g., about 1000 Å, but exemplary embodiments are not limited thereto.

When both layers of the passivation layer 180 are made of an inorganic insulating material, the thickness of the inorganic insulating layer formed on the side surface parts A of the source electrode 173 and the drain electrode 175 is thicker than that of the inorganic insulating layer formed on the channel region by the thickness of the sidewall 81. For example, a thickness t1 of the inorganic insulating layer at a lower portion of the side surface part A may be thicker than a thickness t3 of the inorganic insulating layer on the channel region by about 2000 Å or more, and a thickness t2 of the inorganic insulating layer at a half of the height of the side surface part A may be thicker than a thickness t3 of the inorganic insulating layer by about 1000 Å or more.

A planarization layer 181 formed of, e.g., an organic insulating material, is positioned on the passivation layer 180. The planarization layer may be omitted.

A plurality of contact holes 185 may be formed in the passivation layer 180 and the planarization layer 181 to expose one end of the drain electrode 175. A plurality of pixel electrodes 191 are formed on the planarization layer 181. The pixel electrodes 191 are physically and electrically connected to the drain electrode 175 through the contact hole 185 to receive a data voltage from the drain electrode 175. The pixel electrode 191 may be made of, for example, a TCO such as, for example, indium tin oxide (ITO), indium zinc oxide (IZO), aluminum zinc oxide (AZO), cadmium tin oxide (CTO), or a combination thereof.

Hereinafter, a manufacturing method of a thin film transistor array panel in accordance with an exemplary embodiment of the present invention will be described in connection with FIG. 3 to FIG. 12. In accordance with the present exemplary embodiment, the thin film transistor array panel may be manufactured by using, for example, four masks.

FIG. 3 to FIG. 12 are stepwise cross-sectional views showing the manufacturing method of the thin film transistor array panel in accordance with an exemplary embodiment of the present invention. FIG. 3 to FIG. 10 are stepwise cross-sectional views taken along a line II-II of FIG. 1.

Figure 3:
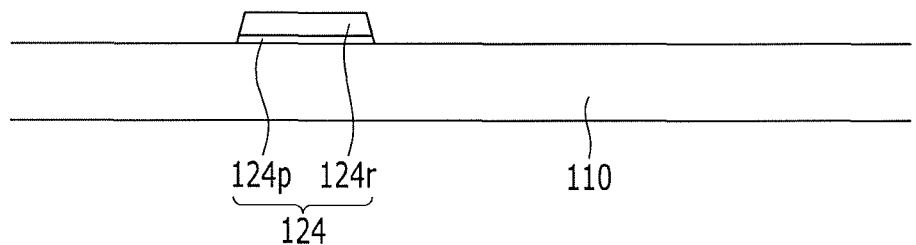
FIG. 3 to FIG. 12 are stepwise cross-sectional views showing a manufacturing method of a thin film transistor array panel in accordance with an exemplary embodiment of the present invention.

Referring to FIG. 3, a double-layer gate conductor layer is formed by, for example, stacking a material selected from a molybdenum-based metal, a chromium-based metal, a titanium-based metal, a tantalum-based metal, and a manganese-based metal on the transparent insulation substrate 110 made of glass, plastic, quartz or the like and stacking a material selected from an aluminum-based metal, a silver-based metal, and a copper-based metal thereon, and then patterning it so as to form the gate electrode 124 and the gate line 121. For example, the double layers are formed, and then a photosensitive film is stacked and patterned. Thereafter, the lower layers 121p and 124p and the upper layers 121r and 124r are etched together by using, for example, the patterned photosensitive film as a mask. In this case, an etchant that can etch both the lower layers 121p and 124p and the upper layers 121r and 124r may be used. The lower layers 121p and 124p may include, for example, titanium and the upper layers 121r and 124r may include, for example, copper, but exemplary embodiments are not limited thereto.

Figure 4:
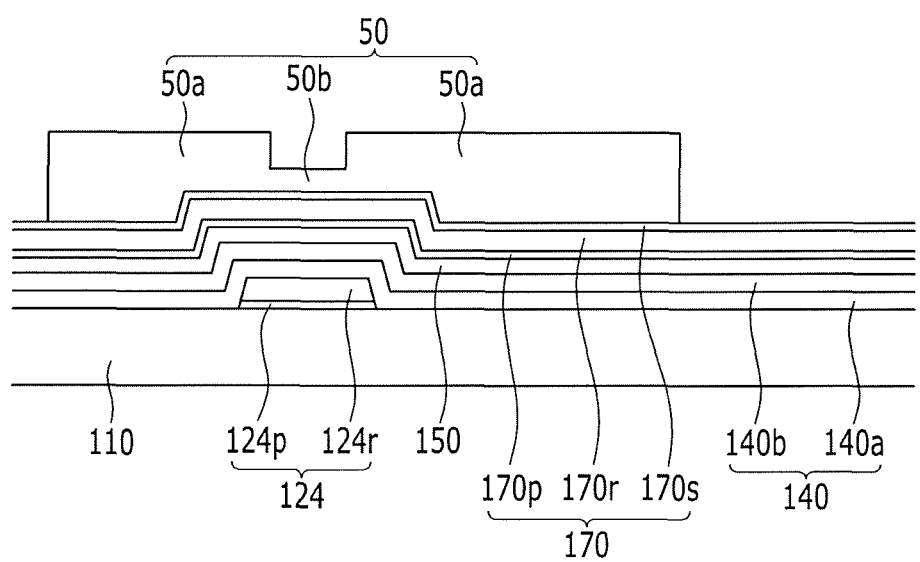

Referring to FIG. 4, a gate insulating layer 140, an oxide layer 150, and a data conductor layer 170 are deposited on the gate line 121 and the gate electrode 124. The data conductor layer 170 includes a bottom layer 170p, a main layer 170r, and a top layer 170s which are sequentially stacked so as to form each of the barrier layers 171p, 173p, and 175p, the main wiring layers 171r, 173r, and 175r and the capping layers 171s, 173s, and 175s.

The gate insulating layer 140 may be formed by, for example, stacking a first insulating layer 140a containing, e.g., a silicon nitride and then stacking a second insulating layer 140b containing a silicon oxide. The oxide layer 150 may be formed as, for example, a single film or multiple films to contain at least one of zinc (Zn), indium (In), tin (Sn), gallium (Ga), and hafnium (Hf).

The bottom layer 170p of the data conductor layer 170 may be formed to include one of, e.g., an indium-zinc oxide, a gallium-zinc oxide, an aluminum-zinc oxide, nickel chromium, a nickel chromium alloy, titanium, chromium, tantalum, a molybdenum-based metal, and a transparent conductive oxide. The main layer may be formed to include, for example, a copper-based material, an aluminum-based material, a silver-based material, a molybdenum-based metal such as molybdenum (Mo) and a molybdenum alloy, a titanium-based metal such as titanium (Ti) and a titanium alloy, or the like. The top layer 170s may be formed to include, e.g., one of nickel chromium, copper manganese, and TCO.

A first photosensitive film pattern 50 may be formed by forming a photosensitive film (photoresist) on the data conductor layer 170 and then patterning it. The first photosensitive film pattern 50 has, for example, a thick first portion 50a and a relatively thin second portion 50b. The thickness difference of the first photosensitive film pattern 50 can be formed by, for example, adjusting an amount of irradiated light with a mask or using a reflow method. In the case where the light amount is adjusted, a slit pattern, a lattice pattern, or a semi-transparent layer may be formed on the mask. The relatively thin second portion 50b having a thin thickness corresponds to a position at which a channel region of the thin film transistor is formed.

Figure 5:
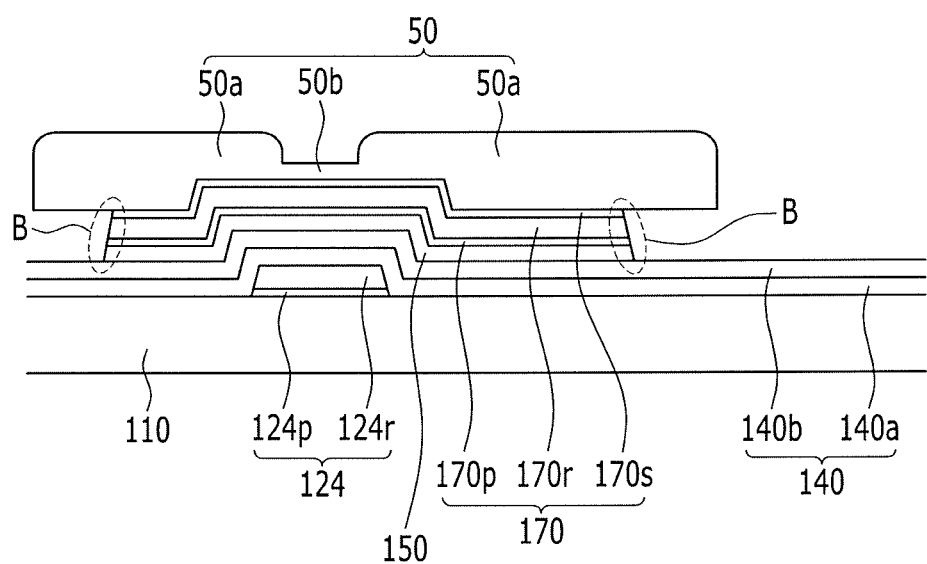
Figure 6:
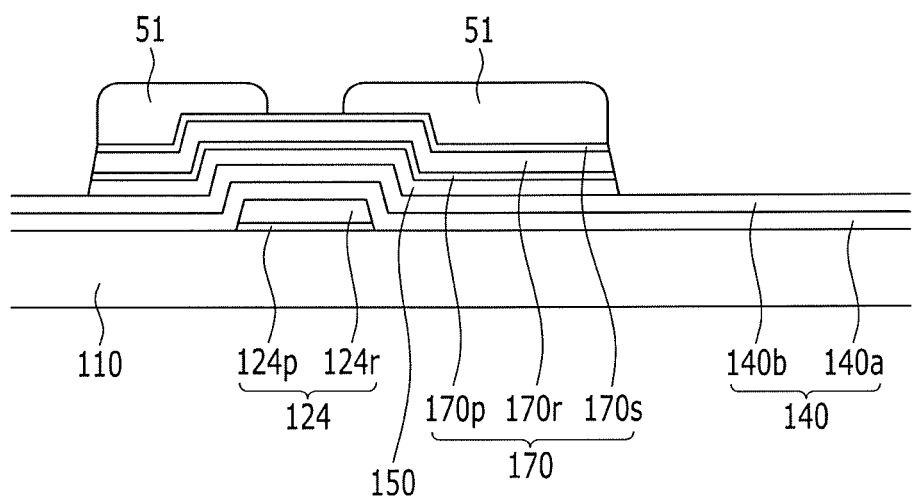

Referring to FIG. 5, the layers 170p, 170r, and 170s of the data conductor layer 170 are, for example, simultaneously etched by using the first photoresist pattern 50 as a mask.

An etchant used in this step may be, for example, the same as the etchant used for etching the gate conductor layer.

As shown in FIG. 5, when the data conductor layer 170 is etched by using an etchant, a side surface of the data conductor layer 170 covered with the first photosensitive film pattern 50 is also etched by the etchant. As a result, a side surface part B of the data conductor layer 170 is exposed, and a boundary line (corresponding to the side surface part B) of the data conductor layer 170 is positioned inside a region in which the first photosensitive film pattern 50 is formed. In this case, the etchant used for etching the data conductor layer 170 does not etch the oxide layer 150. In addition, the oxide layer 150 is etched by using the first photosensitive film pattern 50 as a mask.

Then, the relatively thin second portion 50b shown in FIG. 5 is removed by using, for example, an etch-back method. In this case, the thick first portion 50a is also etched and a width and a height thereof are decreased into a second photoresist pattern 51 shown in FIG. 6. The second photoresist pattern 51 is formed at a region that is narrower than the region at which the first photoresist pattern 50 shown in FIG. 5 is formed.

Figure 7:
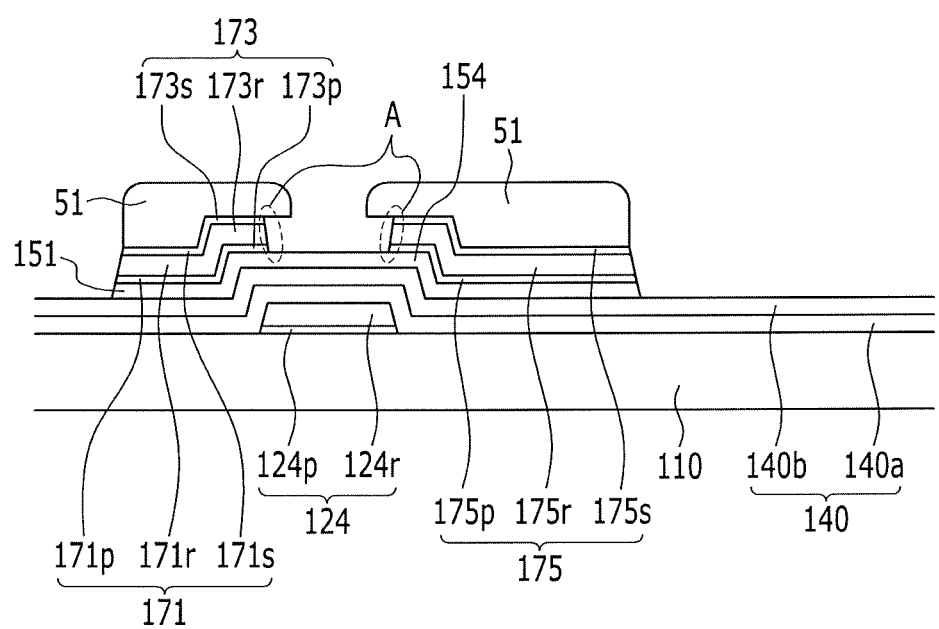

Referring to FIG. 7, the data conductor layer 170 is etched with the etchant by using the second photoresist pattern 51 as the mask.

In this case, the data conductor layer 170 is divided to form the data line (171p, 171r, and 171s), the source electrode (173p, 173r, and 173s), and the drain electrode (175p, 175r, and 175s), each of which is a triple layer, and the opposite side surface parts A of the source electrode (173p, 173r, and 173s) and the drain electrode (175p, 175r, and 175s). Further, the oxide semiconductor layer 151 is formed, which includes the projection 154 forming the channel of the thin film transistor while a top surface of the oxide layer 150 is exposed.

When the photoresist patterns having different thicknesses are used, the semiconductor layer 151 is formed, which has the same plane pattern as the barrier layers 171p, 173p, and 175p of the data line 171, the source electrode 173, and the drain electrode 175. Meanwhile, the semiconductor layer 151 and the projection 154 of the semiconductor layer 151 have substantially the same plane pattern as the data line 171, the source electrode 173, and the drain electrode 175 except for an exposed portion between the drain electrode 175 and the source electrode 173.

Figure 8:
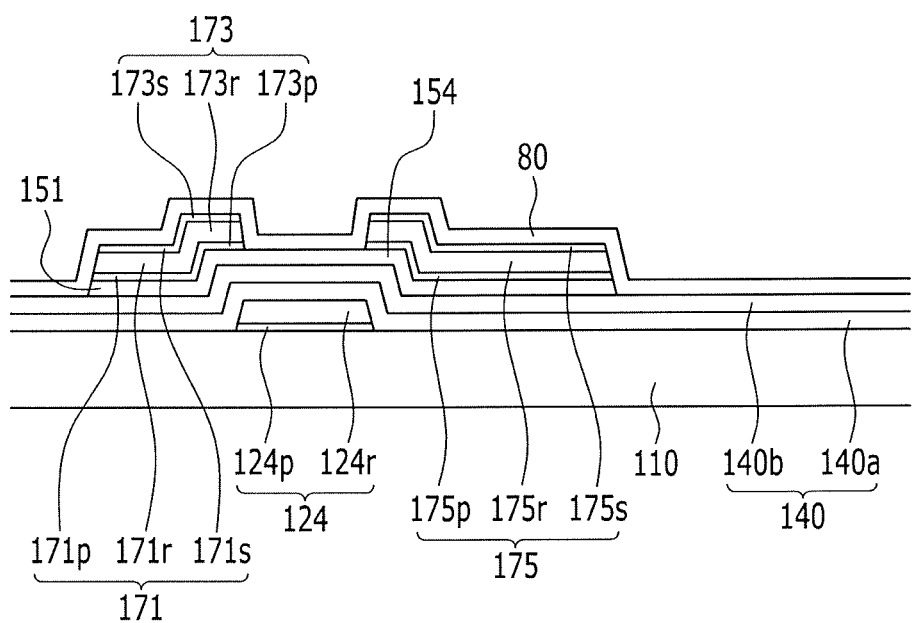

Next, referring to FIG. 8, after the second photoresist pattern 51 is removed by, for example, ashing, a protective insulating layer 80 is formed. The protective insulating layer 80 may be formed to cover the data line 171, the source electrode 173, the drain electrode 175, the channel region of the semiconductor layer 151, and the gate insulating layer 140, of which the surfaces are exposed. The protective insulating layer 80 may be formed of, for example, an inorganic insulating material such as a silicon oxide (SiOx), a silicon nitride (SiNx), and a silicon oxynitride ($SiO_xN_y$). The protective insulating layer 80 may be formed to have a thickness of, e.g., about 2000 Å or more. If the thickness of the protective insulating layer 80 is too thin, it may be difficult to form the sidewall 81 by the following dry etchback.

Figure 9:
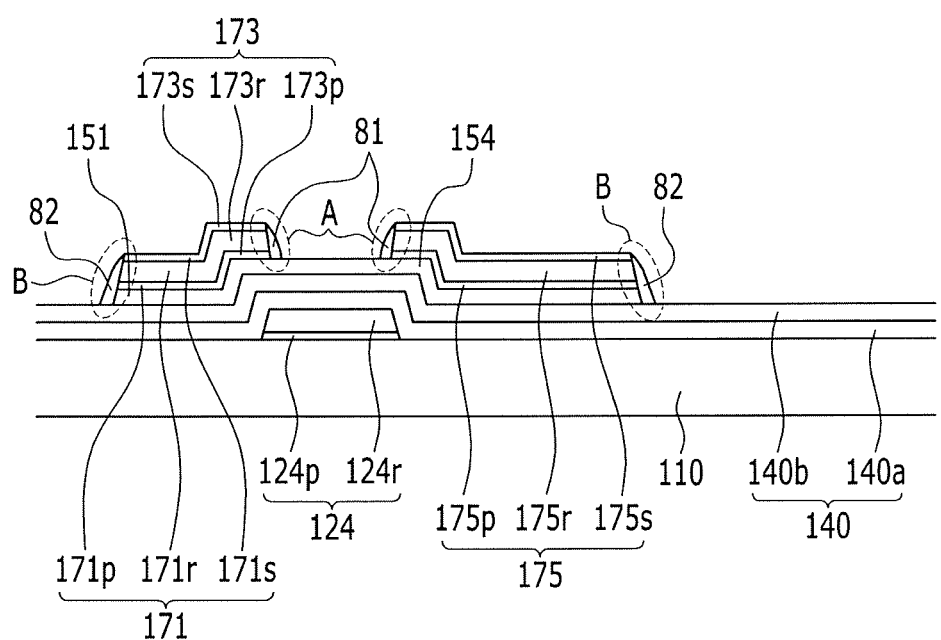

Referring to FIG. 9, the protective insulating layer 80 is removed through, for example, the dry etchback in such a way so as to maintain only the sidewall 81 which covers the side surface parts A of the source electrode 173 and the drain electrode 175 adjacent to the channel region. As a result, the side surface parts A which were exposed before the protective insulating layer 80 is formed are covered by the sidewall 81 as the remaining portion of the protective insulating layer 80, and the channel region of the semiconductor layer 151 is exposed again. Alternatively, in an exemplary embodiment, when the sidewall 81 is formed by etching the protective insulating layer 80, the etching may be performed such that, for example, the protective insulating layer 80 also remains on the channel region. In this case, the protective insulating layer 80 remaining on the channel region should have such a thickness so as to be effective for the following plasma treatment.

The sidewall 81 is formed based on the protective insulating layer 80 through the dry etchback without using a mask. Accordingly, the thickness of the sidewall 81 may gradually increase from the upper portion thereof toward the lower portion thereof. In other words, the upper part of the sidewall 81 may be formed by etching the protective insulating layer 80 to a large degree, while the lower part thereof may be formed by etching the protective insulating layer 80 to a small degree.

Some of the protective insulating layer 80 may remain on the data line 171 which is not adjacent to the channel region and the side surface parts B of the source electrode 173 and the drain electrode 175 to form sidewalls 82. As a result, all the exposed side surface parts of the data conductor may be covered by protective walls formed based on the protective insulating layer 80 like the sidewall 81.

Figure 10:
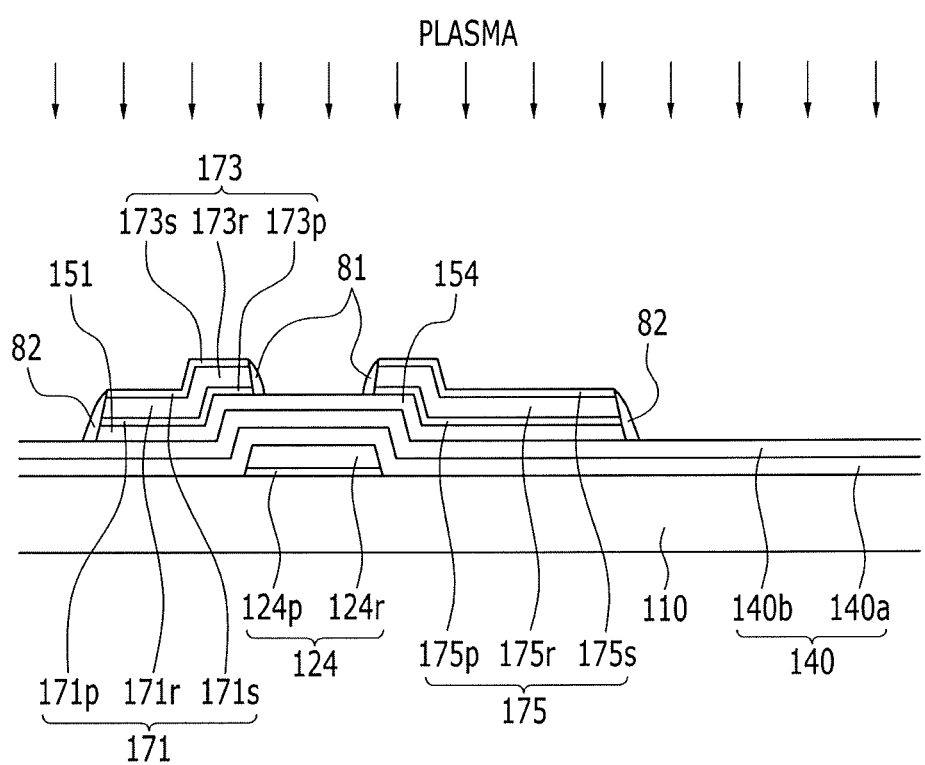

Next, referring to FIG. 10, a plasma treatment process is performed to reduce oxygen vacancies of the channel region of the semiconductor layer 151. The gas used in the plasma treatment process may be, for example, a nitrous oxide ($N_2O$) gas. If the side surface parts A of the source electrode 173 and the drain electrode 175 adjacent to the channel region are exposed instead of being covered by the sidewalls 81, copper-like components of the source electrode 173 and the drain electrode 175 react with oxygen in the plasma treatment process, thereby generating a metal oxide.

In accordance with the present exemplary embodiment, as the side surface parts A are not exposed in the plasma treatment process by the action of the sidewalls 81, the reaction with oxygen to generate the metal oxide is suppressed. Further, the components of the source electrode 173 and the drain electrode 175 are prevented from being separated from the side surface parts A and entering the channel region. As a result, the damage to the profile of the side surface parts caused by formation of the metal oxide on the side surface parts A is prevented, and the possibility for the contamination of the channel region of the semiconductor layer 151 may be significantly reduced. Further, as the side surface parts B of the data conductor which are not adjacent to the channel region are also covered by the sidewall 82, it is possible to prevent formation of the metal oxide in the plasma treatment process.

Figure 11:
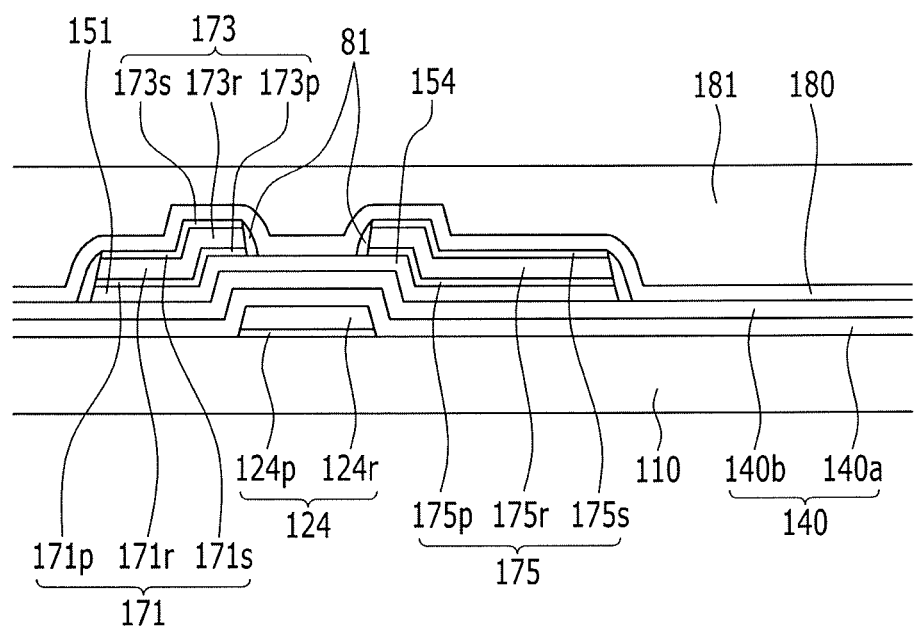

Referring to FIG. 11, the passivation layer 180 is formed after the plasma treatment process. The passivation layer 180 may be formed on the data line 171, the source electrode 173, the drain electrode 175, the channel region of the semiconductor layer 151, and a portion of the gate insulating layer 140 which are not covered by the semiconductor layer 151. The passivation layer 180 may be made of, for example, an inorganic insulating material such as a silicon oxide or a silicon nitride. The planarization layer 181 formed of, for example, an organic insulating material is positioned on the passivation layer 180.

Figure 12:
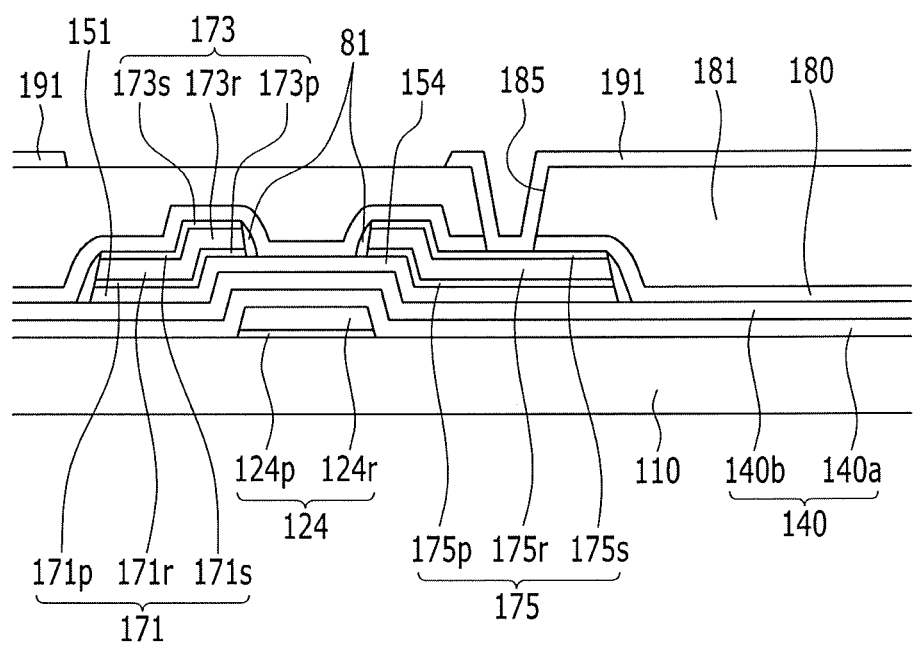

Referring to FIG. 12, the passivation layer 180 and the planarization layer 181 are patterned to form the contact holes 185 through which the drain electrode 175 is partially exposed, and the pixel electrodes 191 are formed on the planarization layer 181 to thereby manufacture the thin film transistor array panel shown in FIG. 2. In this case, the pixel electrodes 191 are formed to be physically and electrically connected to the drain electrode 175 through the contact holes 185.

Hereinafter, a liquid crystal display to which a thin film transistor array panel in accordance with an exemplary embodiment is applied to will be described. However, the thin film transistor array panel in accordance with the present exemplary embodiment may be widely applied to a display device such as an organic light emitting display or an electrophoretic display that performs a switching operation by using a thin film transistor in addition to a liquid crystal display.

Figure 13:
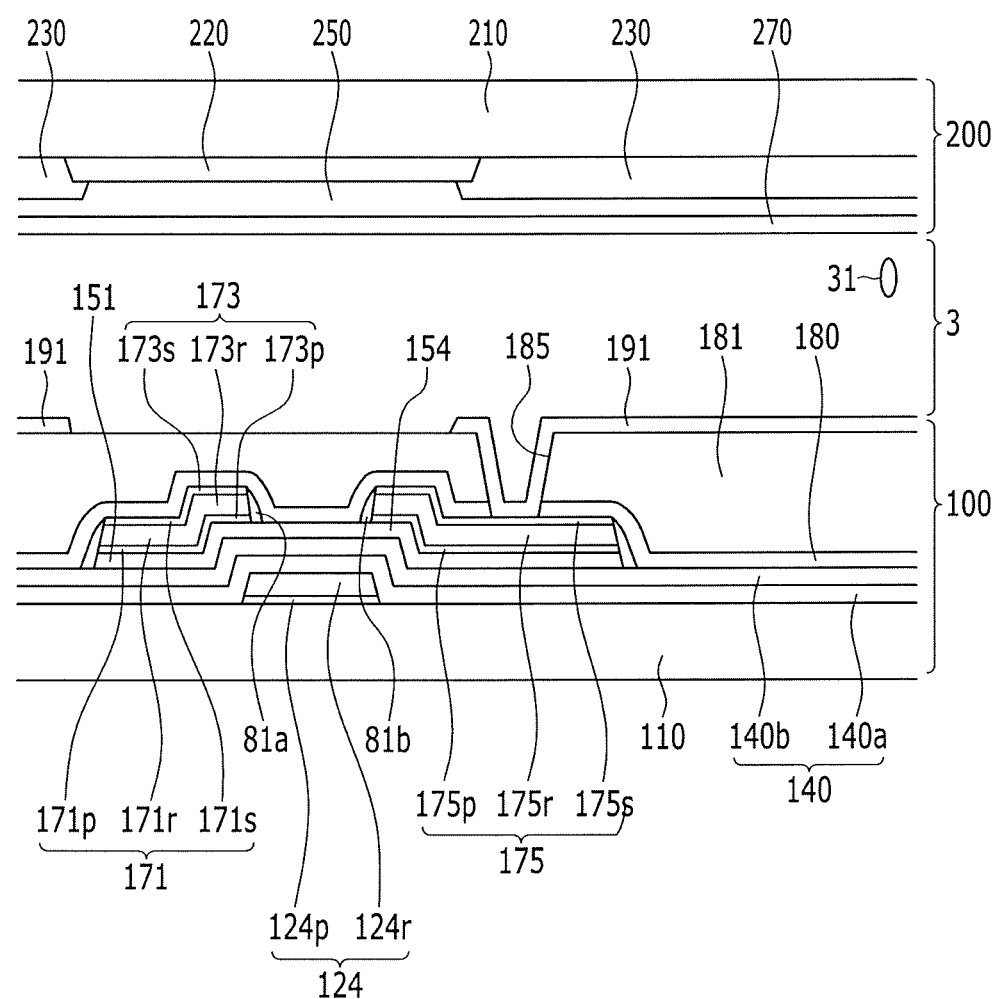
FIG. 13 is a cross-sectional view showing a liquid crystal display in accordance with an exemplary embodiment of the present invention.

FIG. 13 is a cross-sectional view showing a liquid crystal display in accordance with an exemplary embodiment.

Referring to FIG. 13, a second substrate 210 is disposed at a position facing a first substrate 110. The second substrate 210 may be, for example, an insulation substrate made of transparent glass, plastic, or quartz. Further, in an exemplary embodiment, the second substrate 210 may be, for example, a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

A light blocking member 220 is formed on the second substrate 210. The light blocking member 220 is called a black matrix and blocks light leakage.

A plurality of color filters 230 are also formed on the second substrate 210 and the light blocking member 220. The color filters 230 are, for example, most present in a region surrounded by the light blocking member 220 and may be elongated along a row of the pixel electrode 191. Each color filter 230 may express, for example, one of primary colors such as three primary colors of red, green, and blue colors. However, the expressed colors are not limited to three primary colors of the red, green, and blue colors, and, for example, each color filter 230 may express one of cyan, magenta, yellow, and white based colors.

Although the light blocking member 220 and the color filter 230 are formed on an opposed array panel 200 as described above, at least one of the light blocking member 220 and the color filter 230 may be formed on the thin film transistor array panel 100.

An overcoat 250 is formed on the color filter 230 and the light blocking member 220. The overcoat 250 may be made of, for example, an insulation material and prevents the color filter 230 from being exposed and provides a flat surface. The overcoat 250 may be omitted.

A common electrode 270 is formed on the overcoat 250. The common electrode 270 may be made of, for example, a transparent conductive material such as indium tin oxide (ITO), indium zinc oxide (IZO), aluminum zinc oxide (AZO), cadmium tin oxide (CTO), or a combination thereof.

The pixel electrode 191 applied with the data voltage generates an electric field together with the common electrode 270 applied with common voltage to determine a direction of liquid crystal molecules 31 of a liquid crystal layer 3 between the pixel electrode 191 and the common electrode 270. The pixel electrode 191 and the common electrode 270 constitute a capacitor to maintain the applied voltage even after the thin film transistor is turned off.

The pixel electrode 191 overlaps with a storage electrode line to constitute a storage capacitor, and as a result, a voltage storing capability of a liquid crystal capacitor may be reinforced.

The content of the thin film transistor array panel of FIG. 2 may be applied to a description of the thin film transistor array panel 100 of the present exemplary embodiment.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A thin film transistor array panel comprising:
   a gate conductor disposed on a substrate and including a gate line and a gate electrode;
   a semiconductor layer overlapping the gate electrode and including an oxide semiconductor, the semiconductor layer having reduced oxygen vacancies within a channel region thereof resulting from a plasma treatment performed thereon;
   a data conductor including a data line intersecting the gate line, a source electrode connected to the data line, and a drain electrode facing the source electrode;
   a first sidewall disposed directly on the semiconductor layer and covering side surface parts of the drain electrode and the source electrode adjacent to the channel region of the semiconductor layer, the first sidewall configured to prevent the plasma treatment, which reduced oxygen vacancies within the channel region, from reacting with the source and drain electrodes;
   a second sidewall covering both a side surface part of the drain electrode and a side surface part of the semiconductor layer, and covering both a side surface part of the source electrode and a side surface part of the semiconductor layer; and
   a passivation layer covering the source electrode, the drain electrode, the first side wall and the second sidewall.

2. The thin film transistor array panel of claim 1, wherein a thickness of the first sidewall increases from a top surface thereof toward a bottom surface thereof.

3. The thin film transistor array panel of claim 2, wherein the first sidewall has a thickness of at least about 2000 Å at a thickest portion thereof.

4. The thin film transistor array panel of claim 3, wherein the first sidewall has a thickness of at least about 1000 Å at a position which about is half of the entire height thereof.

5. The thin film transistor array panel of claim 4, wherein the first sidewall includes an inorganic insulating material.

6. The thin film transistor array panel of claim 5, wherein the first sidewall includes a silicon oxide.

7. The thin film transistor array panel of claim 1, wherein the semiconductor layer includes at least a ternary-based semiconductor oxide containing a trivalent element, a bivalent element, and oxygen.

8. The thin film transistor array panel of claim 1, wherein the data conductor includes a barrier layer, a main wiring layer, and a capping layer, and the main wiring layer includes a metal selected from the group consisting of a copper-based metal, an aluminum-based metal, a silver-based metal, a molybdenum-based metal, and a titanium-based metal.

9. The thin film transistor array panel of claim 1, wherein the passivation layer includes a silicon oxide.

10. The thin film transistor array panel of claim 1, wherein the semiconductor layer has substantially the same plane pattern as a plane pattern of the source electrode, the drain electrode, and the data line except for the channel region.

11. A manufacturing method of a thin film transistor array panel, the method comprising:
   forming a gate conductor including a gate line and a gate electrode on a substrate;
   forming a gate insulating layer on the gate conductor;
   forming a semiconductor layer including an oxide semiconductor on the gate insulating layer;
   forming a data conductor including a source electrode and a drain electrode on the semiconductor layer;
   forming an insulating layer on the data conductor and directly on the semiconductor layer;
   removing the insulating layer such that the insulating layer partially remains on side surface parts of the drain electrode and the source electrode adjacent to a channel region of the semiconductor layer to form a first sidewall disposed directly on the semiconductor layer and covering the side surface parts adjacent to the channel region and to form a second sidewall covering both a side surface part of the drain electrode and a side surface part of the semiconductor layer, and covering both a side surface part of the source electrode and a side surface part of the semiconductor layer;
   performing a plasma treatment process, after the forming of the first sidewall, to reduce oxygen vacancies within the channel region of the semiconductor layer; and
   forming a passivation layer covering the source electrode, the drain electrode, the first sidewall and the second sidewall, wherein the plasma treatment process is performed before forming the passivation layer.

12. The manufacturing method of claim 11, wherein the plasma treatment process is performed using nitrogen oxide gas.

13. The manufacturing method of claim 12, wherein the insulating layer is formed to have a thickness of at least about 2000 Å.

14. The manufacturing method of claim 13, wherein the insulating layer includes a silicon oxide.

15. The manufacturing method of claim 14, wherein the removing of the insulating layer to form the first and second sidewalls is performed by a dry etchback process.

16. The manufacturing method of claim 14, wherein the removing of the insulating layer to form the first and second sidewalls is performed by removing the insulating layer such that the insulating layer partially remains on the channel region of the semiconductor layer, as well as on the side surface parts of the drain electrode and the source electrode adjacent to the channel region of the semiconductor layer.

17. The manufacturing method of claim 11, wherein the semiconductor layer includes at least a ternary-based semiconductor oxide containing a trivalent element, a bivalent element, and oxygen.

18. The manufacturing method of claim 11, wherein the data conductor includes a barrier layer, a main wiring layer, and a capping layer, and the main wiring layer includes a metal selected from the group consisting of a copper-based metal, an aluminum-based metal, a silver-based metal, a molybdenum-based metal, and a titanium-based metal.

19. The manufacturing method of claim 11, wherein the forming of the semiconductor layer and the forming of the data conductor are simultaneously performed by using one mask.

20. The manufacturing method of claim 11, wherein the semiconductor layer has substantially the same plane pattern as the plane pattern of the source electrode, the drain electrode, and the data line except for the channel region.

* * * * *